(12) United States Patent
Miyagaki (10) Patent No.: US 11,250,194 B2
(45) Date of Patent: Feb. 15, 2022

(54) FPGA SYSTEM, PARTIAL RECONFIGURATION EXECUTION METHOD, AND STORAGE MEDIUM

(71) Applicant: NEC CORPORATION, Tokyo (JP)

(72) Inventor: Takayuki Miyagaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/771,503

(22) PCT Filed: Dec. 5, 2018

(86) PCT No.: PCT/JP2018/044719
§ 371 (c)(1),
(2) Date: Jun. 10, 2020

(87) PCT Pub. No.: WO2019/116984
PCT Pub. Date: Jun. 20, 2019

(65) Prior Publication Data
US 2021/0182464 A1    Jun. 17, 2021

(30) Foreign Application Priority Data
Dec. 12, 2017   (JP) .............................. JP2017-237918

(51) Int. Cl.
*G06F 30/30*      (2020.01)
*G06F 30/34*      (2020.01)
(52) U.S. Cl.
CPC .................................... *G06F 30/34* (2020.01)
(58) Field of Classification Search
CPC ....................................................... G06F 30/34
See application file for complete search history.

(56) References Cited

U.S. PATENT DOCUMENTS

| 6,810,514 B1* | 10/2004 | Alfke | ...................... G06F 30/34 |
| | | | 326/38 |
| 2010/0058274 A1* | 3/2010 | Pike | ........................ H04L 45/60 |
| | | | 716/128 |

(Continued)

FOREIGN PATENT DOCUMENTS

| JP | 2010-117968 A | 5/2010 |
| JP | 2015-139009 A | 7/2015 |

(Continued)

OTHER PUBLICATIONS

International search report for PCT/JP2018/044719 dated Jan. 15, 2019.

(Continued)

*Primary Examiner* — Jack Chiang
*Assistant Examiner* — Brandon Bowers
(74) *Attorney, Agent, or Firm* — Sughrue Mion, PLLC (57) ABSTRACT

An FPGA system includes: an FPGA configured such that a partial reconfiguration is executable; and an external storage medium that is positioned outside of the FPGA and stores configuration data that is readable by the FPGA. The external storage medium stores first configuration data indicating a configuration of a circuit that is not subject to the partial reconfiguration and a second configuration data indicating a configuration of a circuit that is subject to the partial reconfiguration. The first configuration data includes configuration data indicating a configuration of a reconfiguration activation circuit for reading the second configuration data from the external storage medium and deploying the configuration indicated by the second configuration data.

6 Claims, 7 Drawing Sheets

(56) References Cited

U.S. PATENT DOCUMENTS

2016/0342722 A1* 11/2016 Sentieys ................ G06F 30/34
2017/0300774 A1* 10/2017 Tamai ................... G06K 9/4614
2018/0260257 A1* 9/2018 Okada ..................... G06F 9/468

FOREIGN PATENT DOCUMENTS

| JP | 2016-057828 A | 4/2016 |
| JP | 2017-191566 A | 10/2017 |
| WO | 2017/199383 A1 | 11/2017 |
| WO | 2018/131065 A1 | 7/2018 |

OTHER PUBLICATIONS

Japanese Notice of Allowance for JP Application No. 2019-559578 dated Apr. 27, 2021 with English Translation.

* cited by examiner

FIG. 8

FPGA SYSTEM, PARTIAL RECONFIGURATION EXECUTION METHOD, AND STORAGE MEDIUM

CROSS REFERENCE TO RELATED APPLICATIONS

This application is a National Stage of International Application No. PCT/JP2018/044719 filed Dec. 5, 2018, claiming priority based on Japanese Patent Application No. 2017-237918, filed Dec. 12, 2017, the disclosure of which is incorporated herein in its entirety.

TECHNICAL FIELD

The present invention relates to an FPGA system, a partial reconfiguration execution method, and a storage medium.

BACKGROUND ART

An FPGA (Field Programmable Gate Array) is an integrated circuit in which a user can set a circuit configuration by deploying a circuit configuration. As one FPGA, there is known an FPGA in which a partial reconfiguration for changing a part of a circuit is executable while the FPGA is operating.

Several techniques have been proposed in connection with this partial reconfiguration.

For example, in the image processing device described in Patent Document 1, configuration data is stored in a hard disk in advance for each PR region (a target region for dynamic partial reconfiguration) of a plurality of PR regions. When there is an instruction for partial reconstruction, the CPU determines whether there is an empty PR region. If there is an empty PR region, partial reconstruction is performed in the empty PR region. On the other hand, if there is no free PR region, the CPU loads the configuration data of each PR region from the hard disk into the RAM, and waits for partial reconfiguration to be possible in any of the PR regions.

The logic program data protection system for a reconfigurable logical device described in Patent Document 2 generates a secret key using an ID unique to the device. This system obtains encrypted logic program data from an external storage device, decrypts the data using a secret key, and verifies the integrity of the decrypted logical program data.

PRIOR ART DOCUMENTS

Patent Documents

[Patent Document 1] Japanese Patent Publication No. 2016-057828
[Patent Document 2] Japanese Patent Publication No. 2010-117968

SUMMARY OF THE INVENTION

Problem to be Solved by the Invention

When the FPGA stores configuration data (data indicating the configuration) in volatile memory in the FPGA, when the FPGA is restarted by a reset or a temporary power-off, the configuration data stored in the volatile memory is lost.

Here, if the FPGA is configured to automatically read configuration data from an external storage medium at the time of startup, the configuration data can be read at the time of restart. However, when the FPGA executes a partial reconfiguration before the restart, it is conceivable that the circuit configured by the FPGA will revert to the circuit before the partial reconfiguration (the time of startup) instead of the circuit after the partial reconfiguration (before the restart).

Neither Patent Document 1 or 2 discloses a method of the FPGA storing configuration data in volatile memory and, after a restart following the execution of a partial reconfiguration, making the circuit configured by the FPGA the circuit after the partial reconfiguration.

An example object of the present invention is to provide an FPGA system, a partial reconfiguration execution method, and a storage medium that can solve the above-described problems.

Means for Solving the Problem

According to a first example aspect of the present invention, an FPGA system includes: an FPGA configured such that a partial reconfiguration is executable; and an external storage medium that is positioned outside of the FPGA and stores configuration data that is readable by the FPGA. The external storage medium stores first configuration data indicating a configuration of a circuit that is not subject to the partial reconfiguration and a second configuration data indicating a configuration of a circuit that is subject to the partial reconfiguration. The first configuration data includes configuration data indicating a configuration of a reconfiguration activation circuit for reading the second configuration data from the external storage medium and deploying the configuration indicated by the second configuration data.

According to a second example aspect of the present invention, a partial reconfiguration execution method includes: storing first configuration data and second configuration data in an external storage medium, the external storage medium being positioned outside of an FPGA and storing configuration data that is readable by the FPGA, the FPGA being configured such that a partial reconfiguration is executable, the first configuration data indicating a configuration of a circuit that is not subject to the partial reconfiguration, the first configuration data including configuration data indicating a configuration of a reconfiguration activation circuit, the second configuration data indicating a configuration of a circuit that is subject to the partial reconfiguration; configuring, by the FPGA, the configuration activation circuit by reading the first configuration data from the external storage medium and by deploying the configuration indicated by the first configuration data; reading the second configuration data from the external storage medium and deploying the configuration indicated by the second configuration data, by the configured reconfiguration activation circuit; and after the second configuration data stored in the external storage medium has been updated, further reading the updated second configuration data from the external storage medium and deploying the configuration indicated by the updated second configuration data, by the reconfiguration activation circuit.

According to a third example aspect of the present invention, a partial reconfiguration execution method includes: storing, in an external storage medium, first configuration data, a plurality of pieces of second configuration data and identification information, the external storage medium being positioned outside of an FPGA and storing configuration data that is readable by the FPGA, the FPGA being configured such that a partial reconfiguration is executable, the first configuration data indicating a configuration of a circuit that is not subject to the partial reconfiguration, the first configuration data including configuration data indicating a configuration of a reconfiguration activation circuit, the plurality of pieces of second configuration data indicating a configuration of a circuit that is subject to the partial reconfiguration, the identification information being information for identifying second configuration data to be read by the FPGA among the plurality of pieces of second configuration data; configuring, by the FPGA, the configuration activation circuit by reading the first configuration data from the external storage medium and by deploying the configuration indicated by the first configuration data; and after the identification information stored by the external storage medium has been updated, further reading the second configuration data identified by the updated identification information from the external storage medium and deploying the configuration indicated by the second configuration data, by the reconfiguration activation circuit.

According to a fourth example aspect of the present invention, a storage medium is a storage medium that stores configuration data that is readable by an FPGA configured such that a partial reconfiguration is executable, the storage medium storing first configuration data and second configuration data, the first configuration data indicating a configuration of a circuit that is not subject to the partial reconfiguration, the second configuration data indicating a configuration of a circuit that is subject to the partial reconfiguration, the first configuration data including configuration data indicating a configuration of a reconfiguration activation circuit for reading the second configuration data from the storage medium and deploying the configuration indicated by the second configuration data.

Effect of the Invention

According to an example embodiment of the present invention, an FPGA stores configuration data in the volatile memory and upon restarting after the execution of a partial reconfiguration, the circuit configured by the FPGA can be made the circuit after the execution of the partial reconfiguration.

EXAMPLE EMBODIMENTS FOR CARRYING OUT THE INVENTION

Hereinafter, example embodiments of the present invention will be described, but the following example embodiments are not limiting the invention according to the claims. In addition, not all combinations of the features described in the example embodiments are necessarily essential to the solution of the invention.

Figure 1:
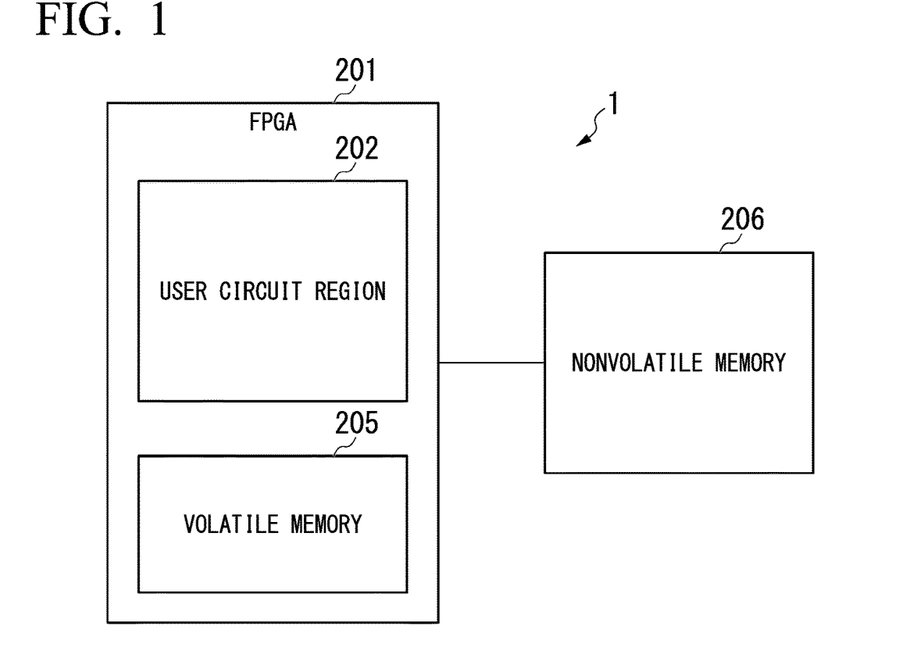
FIG. 1 is a schematic configuration diagram illustrating the hardware configuration of an FPGA (Field Programmable Gate Array) system according to an example embodiment of the present invention.

FIG. 1 is a schematic configuration diagram showing a hardware configuration of an FPGA (Field Programmable Gate Array) system according to an example embodiment of the present invention. As shown in FIG. 1, the FPGA system 1 includes an FPGA 201 and a nonvolatile memory 206. The FPGA 201 includes a user circuit region 202 and a volatile memory 205.

The FPGA system 1 configures a circuit according to a configuration set by a user.

The nonvolatile memory 206 stores configuration data set by the user. Here, the configuration data is data indicating the configuration. The nonvolatile memory 206 retains the data even when power is not supplied.

The FPGA 201 reads a configuration from the nonvolatile memory 206 using configuration data, and configures a circuit according to the read configuration.

The user circuit region 202 is a region where a user circuit can be set and changed. The user circuit here is a circuit whose configuration is instructed by configuration data.

A preset portion of the user circuit region 202 can be dynamically reconfigured. That is, an FPGA capable of Partial Reconfiguration is used as the FPGA 201. Partial reconfiguration here means changing a part of a circuit configured by the FPGA while operating the FPGA.

The volatile memory 205 stores the configuration data read from the nonvolatile memory 206. When power is not supplied to the volatile memory 205, the data stored in the volatile memory 205 is erased. Therefore, when the FPGA 201 is turned on and started up, the FPGA 201 reads configuration data from the nonvolatile memory 206 and stores the read configuration data in the volatile memory 205.

Publicly known components can be used as the FPGA 201 and the nonvolatile memory 206.

Figure 2:
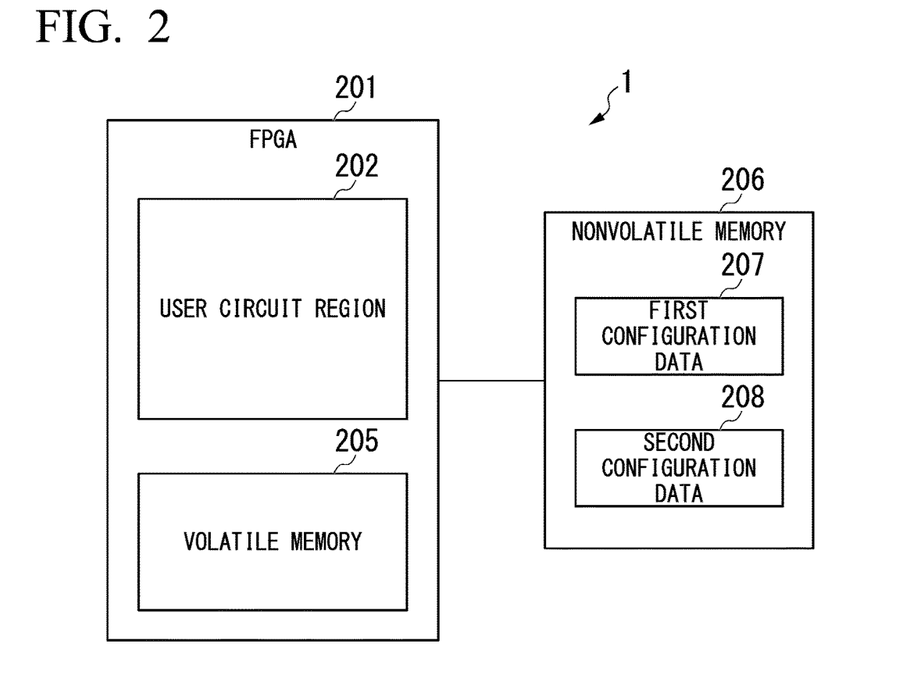
FIG. 2 is a schematic block diagram showing the function configuration of the FPGA system in a state where configuration data is stored in a nonvolatile memory according to the example embodiment of the present invention.

FIG. 2 is a schematic block diagram showing a function configuration of the FPGA system 1 in a state where configuration data is stored in the nonvolatile memory 206. In the state shown in FIG. 2, the nonvolatile memory 206 stores first configuration data 207 and second configuration data 208 with the hardware configuration shown in FIG. 1.

The first configuration data 207 is configuration data indicating a configuration of a portion other than the portion to be partially reconfigured, among configurations for causing the FPGA 201 to set a circuit. The second configuration data 208 is configuration data indicating a configuration of a portion to be reconfigured among the configurations for causing the FPGA 201 to set a circuit.

Figure 3:
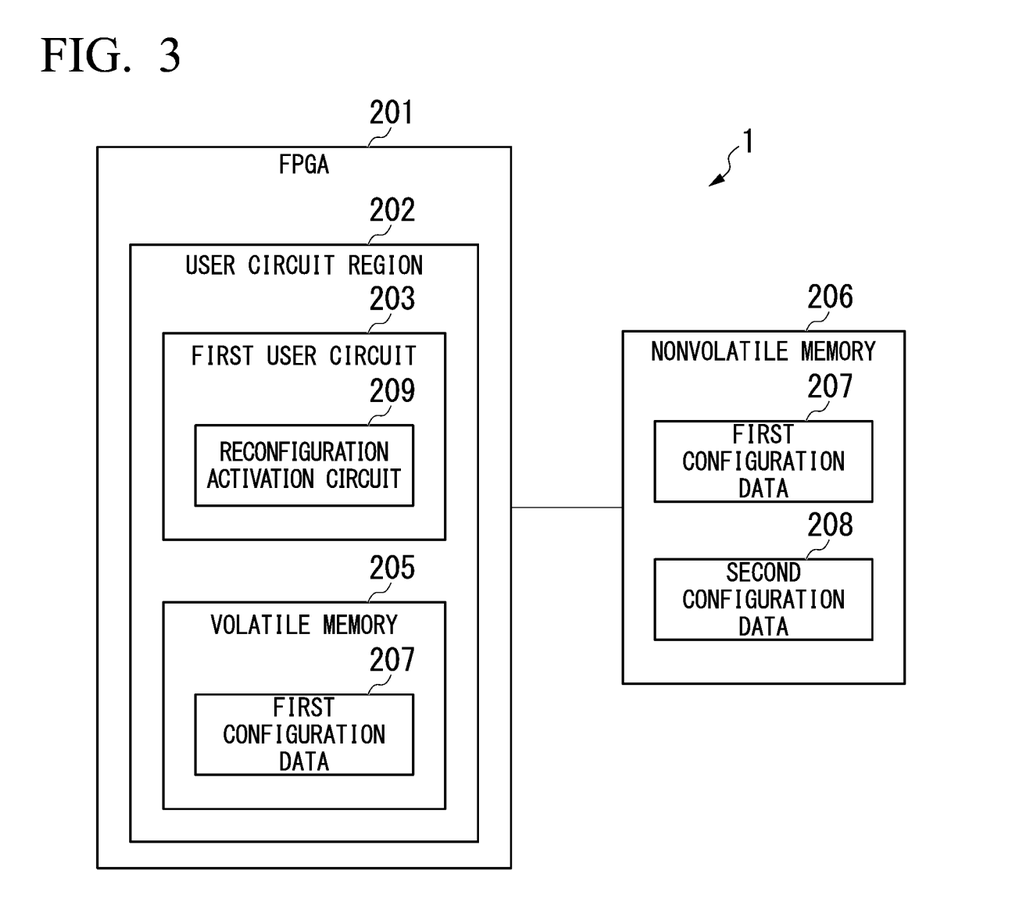
FIG. 3 is a schematic block diagram showing the function configuration of the FPGA system in a state where the FPGA according to the example embodiment of the present invention reads and deploys first configuration data.

FIG. 3 is a schematic block diagram showing a function configuration of the FPGA system 1 in a state where the FPGA 201 reads and deploys the first configuration data 207. In the state shown in FIG. 3, the volatile memory 205 stores the first configuration data 207, and the user circuit region 202 configures the first user circuit 203 from the state shown in FIG. 2. The first user circuit 203 is configured to include a reconfiguration activation circuit 209.

The reconfiguration activation circuit 209 is a circuit that reads the second configuration data 208 from the nonvolatile memory 206, stores the second configuration data 208 in the volatile memory 205, and deploys the configuration indicated by the stored second configuration data 208 in the user circuit region 202.

When the power is turned on and the FPGA 201 is activated from the state shown in FIG. 2, the FPGA 201 reads the first configuration data 207 from the nonvolatile memory 206 and stores the first configuration data 207 in the volatile memory 205. Then, the FPGA 201 deploys in the user circuit region 202 the configuration indicated by the first configuration data 207 stored in the volatile memory 205. The first configuration data 207 is configuration data indicating the first user circuit 203, and the user circuit region 202 configures the first user circuit 203 by the deployment. Further, the first configuration data 207 includes configuration data indicating the reconfiguration activation circuit 209, and the user circuit region 202 is configured to include the reconfiguration activation circuit 209 in the first user circuit 203.

Figure 4:
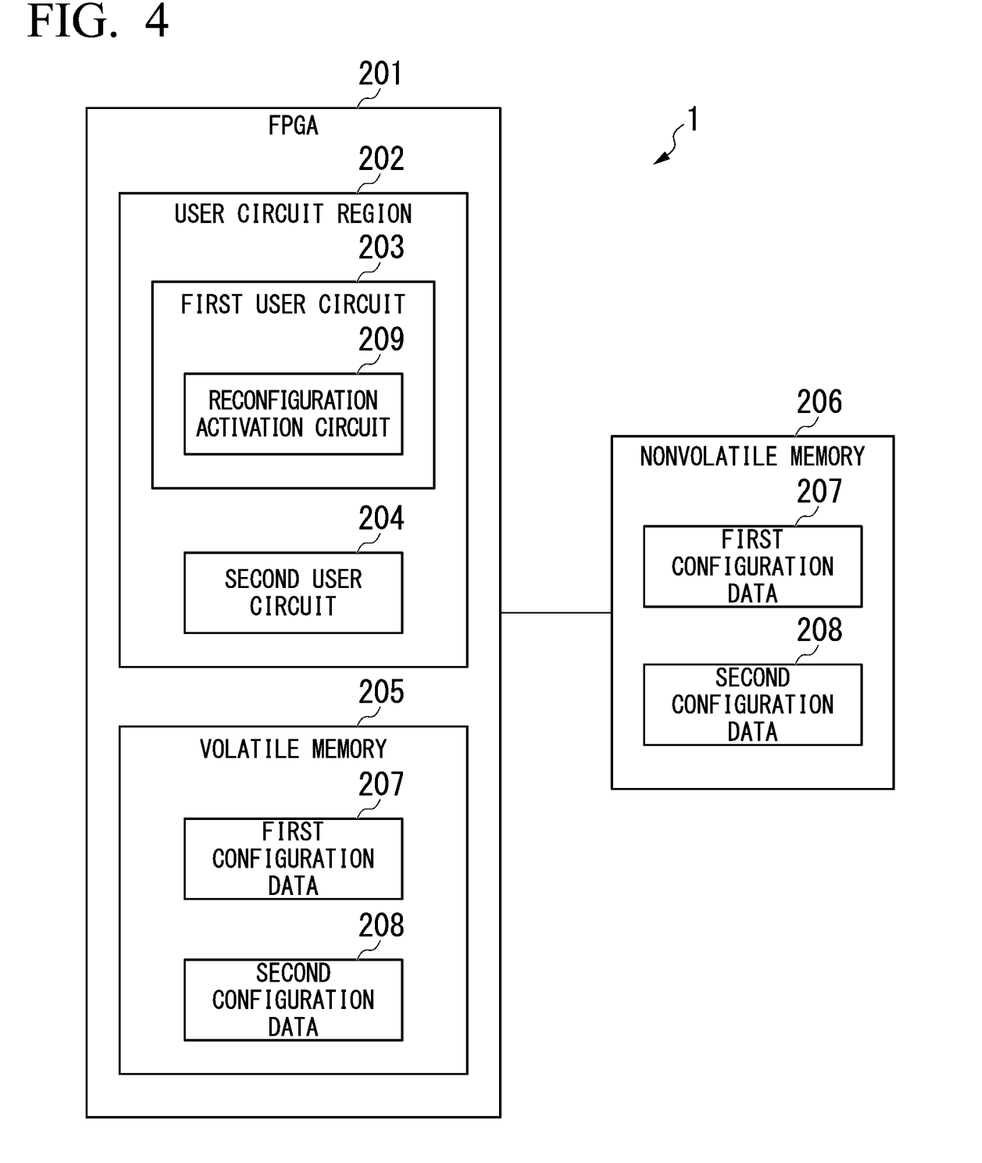
FIG. 4 is a schematic block diagram showing the function configuration of the FPGA system in a state where the FPGA according to an example embodiment of the present invention reads and deploys second configuration data.

FIG. 4 is a schematic block diagram showing a function configuration of the FPGA system 1 in a state where the FPGA 201 reads and deploys the second configuration data 208. In the state shown in FIG. 4, the volatile memory 205 stores the second configuration data 208, and the user circuit region 202 configures a second user circuit 204 from the state shown in FIG. 3.

From the state shown in FIG. 3, the reconfiguration activation circuit 209 goes into operation upon being configured in the user circuit region 202. The reconfiguration activation circuit 209 reads the second configuration data 208 from the nonvolatile memory 206 and stores the second configuration data 208 in the volatile memory 205. Then, the reconfiguration activation circuit 209 deploys in the user circuit region 202 the configuration indicated by the second configuration data 208 stored in the volatile memory 205. The second configuration data 208 is configuration data indicating the second user circuit 204, and the user circuit region 202 configures the second user circuit 204 by the deployment.

When performing partial reconfiguration, the user updates the second configuration data 208 and operates the reconfiguration activation circuit 209. When operated according to a user's instruction, the reconfiguration activation circuit 209 reads the updated second configuration data 208 from the nonvolatile memory 206 and overwrites the pre-updated second configuration data 208 stored in the volatile memory 205. Then, the reconfiguration activation circuit 209 deploys the reconfiguration indicated by the updated second configuration data 208 overwritten on the volatile memory 205 in a portion of the user circuit region 202 which is set to be dynamically reconfigurable. The portion that is set to be dynamically reconfigurable is the portion where the second user circuit 204 is configured, and the second user circuit 204 is updated by the deployment. This update corresponds to an example of partial reconfiguration.

The nonvolatile memory 206, which is located outside the FPGA 201, stores the first configuration data 207 and the second configuration data 208, including in the first configuration data 207 the configuration of the reconfiguration activation circuit 209. The nonvolatile memory 206 corresponds to an example of a storage medium and an example of an external storage medium. However, neither the storage medium nor the external storage medium used here is limited to a nonvolatile storage medium. For example, the FPGA system 1 may include a volatile storage medium instead of the nonvolatile memory 206, and the power of the volatile storage medium may be kept on when the power of the FPGA 201 is turned off.

For the sake of comparison with the FPGA 201, a case will be described in which the configuration data includes a portion to be reconfigured and does not include configuration data for configuring a reconfiguration activation circuit.

Figure 5:
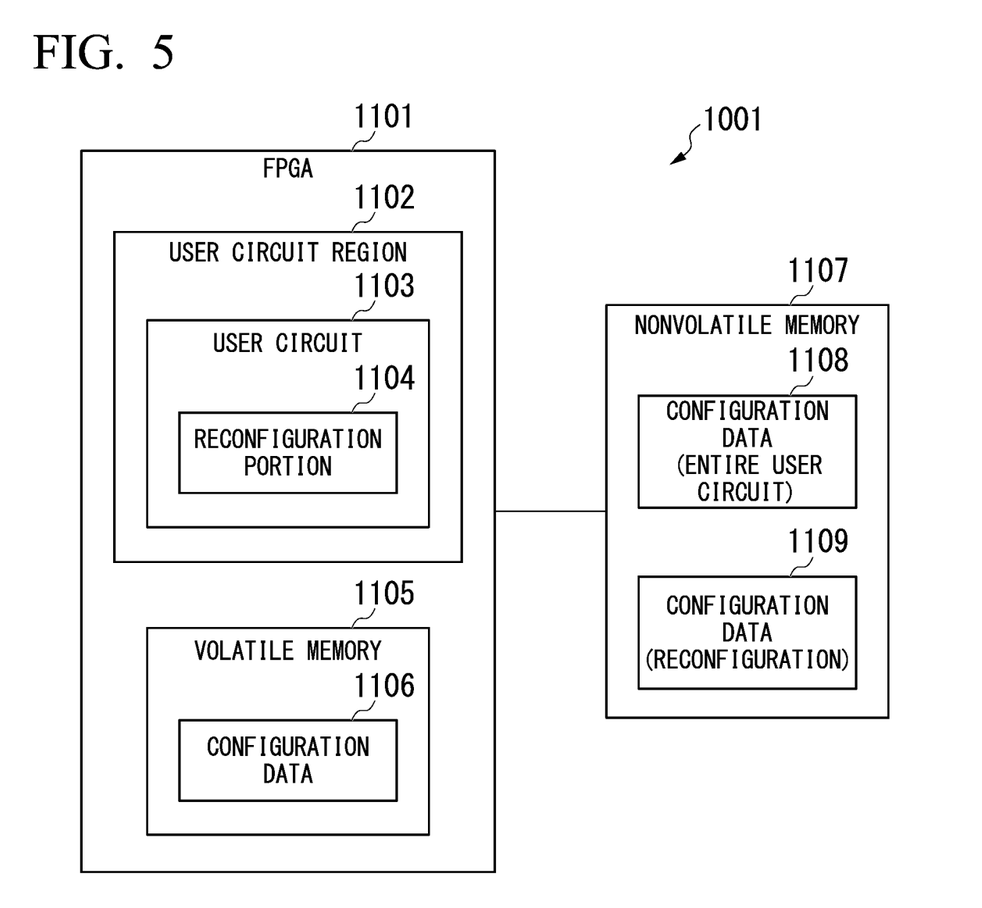
FIG. 5 is a schematic block diagram showing the function configuration of the FPGA system in the case of the configuration data including the portion to be reconfigured and not including configuration data for configuring a reconfiguration activation circuit.

FIG. 5 is a schematic block diagram showing a function configuration of the FPGA system when the configuration data includes a portion to be reconfigured and does not include configuration data for configuring a reconfiguration activation circuit. As shown in FIG. 5, the FPGA system 1001 is provided with an FPGA 1101 and a nonvolatile memory 1107. The FPGA 1101 includes a user circuit region 1102 and a volatile memory 1105.

The FPGA 1101 is a partially reconfigurable FPGA, and can dynamically reconfigure a previously set portion of the user circuit region 1102. In FIG. 5, a target portion of the partial reconfiguration of the user circuit 1103 set in the user circuit region 1102 is shown as a reconfiguration portion 1104.

In the configuration shown in FIG. 5, the nonvolatile memory 1107 stores configuration data 1108 and 1109. The configuration data 1108 is configuration data indicating the configuration of the entire user circuit 1103 set in the user circuit region 1102 when the FPGA 1101 is started, and includes the configuration data of the reconfigurable portion 1104. The configuration data 1109 is configuration data used for partial reconfiguration, and indicates the configuration of the circuit configured as the reconfiguration portion 1104.

When the power of the FPGA 1101 is off, the volatile memory 1105 does not store data, and the user circuit region 1102 does not configure a user circuit.

When the FPGA 1101 is started by turning on the power of the FPGA 1101 while the configuration data 1108 is stored in the nonvolatile memory 1107, the FPGA 1101 reads the configuration data 1108 from the nonvolatile memory 1107 and stores the configuration data 1108 in the volatile memory 1105. In this state, configuration data 1106 stored in the volatile memory 1105 is the configuration data 1108.

Then, the FPGA 1101 deploys in the user circuit region 1102 the configuration indicated by the configuration data 1108, stored in the volatile memory 1105. With this deployment, the user circuit region 1102 configures the user circuit 1103. Since the configuration data 1108 includes the configuration data of the reconfigurable portion 1104, the user circuit region 1102 is configured to include the reconfigurable portion 1104 in the user circuit 1103.

When performing the partial reconfiguration, the user instructs the FPGA 1101 to perform the partial reconfiguration while the nonvolatile memory 1107 stores the configuration data 1109. It is sufficient that the configuration data 1109 is stored in the nonvolatile memory 1107 before the start of the partial reconfiguration, and it may be stored before or after the startup of the FPGA 1101.

The FPGA 1101 reads the configuration data 1109 from the nonvolatile memory 1107 and stores the configuration data 1109 in the volatile memory 1105 in accordance with the user instruction to perform the partial reconfiguration. As a result, of the configuration data 1106 stored in the volatile memory 1105, the configuration data of the reconfiguration portion 1104 is overwritten on the configuration data 1109.

The FPGA 1101 deploys the configuration data 1109 stored in the volatile memory 1105 to the portion of the user circuit region 1102 set to be dynamically reconfigurable. With this deployment, the reconfigurable portion 1104 of the user circuit 1103, which was set at startup of the FPGA 1101, is updated. This update corresponds to an example of partial reconfiguration.

Here, the case will be considered in which the FPGA 1101 is restarted after executing a partial reconfiguration. Examples of the case where the FPGA 1101 is restarted include a case in which the FPGA 1101 is reset due to a malfunction of the FPGA 1101 or a temporary power-off, and a case in which the FPGA 1101 is turned off and then turned on again.

When the FPGA 1101 is restarted, the configuration data 1106 stored in the volatile memory 1105 is once erased. In addition, the user circuit configured by the user circuit region 1102 is once erased.

From this state, the FPGA 1101 reads the configuration data 1108 from the nonvolatile memory 1107, stores the configuration data 1108 in the volatile memory 1105, and deploys in the user circuit region 1102 the configuration indicated by the stored configuration data 1108 similarly to during startup as described above. Thus, upon being restarted the FPGA 1101 returns to the state prior to the execution of the partial reconfiguration.

On the other hand, in the FPGA system 1, the nonvolatile memory 206 stores the first configuration data 207 and the second configuration data 208 separately. The FPGA 201 reads the first configuration data 207 from the nonvolatile memory 206 and deploys the first configuration data 207 in the user circuit region 202, whereby the user circuit region 202 configures the reconfiguration activation circuit 209. The reconfiguration activation circuit 209 reads the second configuration data 208 from the nonvolatile memory 206 and deploys the second configuration data 208 in the user circuit region 202, whereby the user circuit region 202 configures a user circuit (the first user circuit 203 and the second user circuit 204) after execution of the partial reconfiguration.

Here, the nonvolatile memory may store a plurality of pieces of second configuration data, and each of the plurality of pieces of second configuration data may be identified by an identification number. This will be described with reference to FIG. 6.

Figure 6:
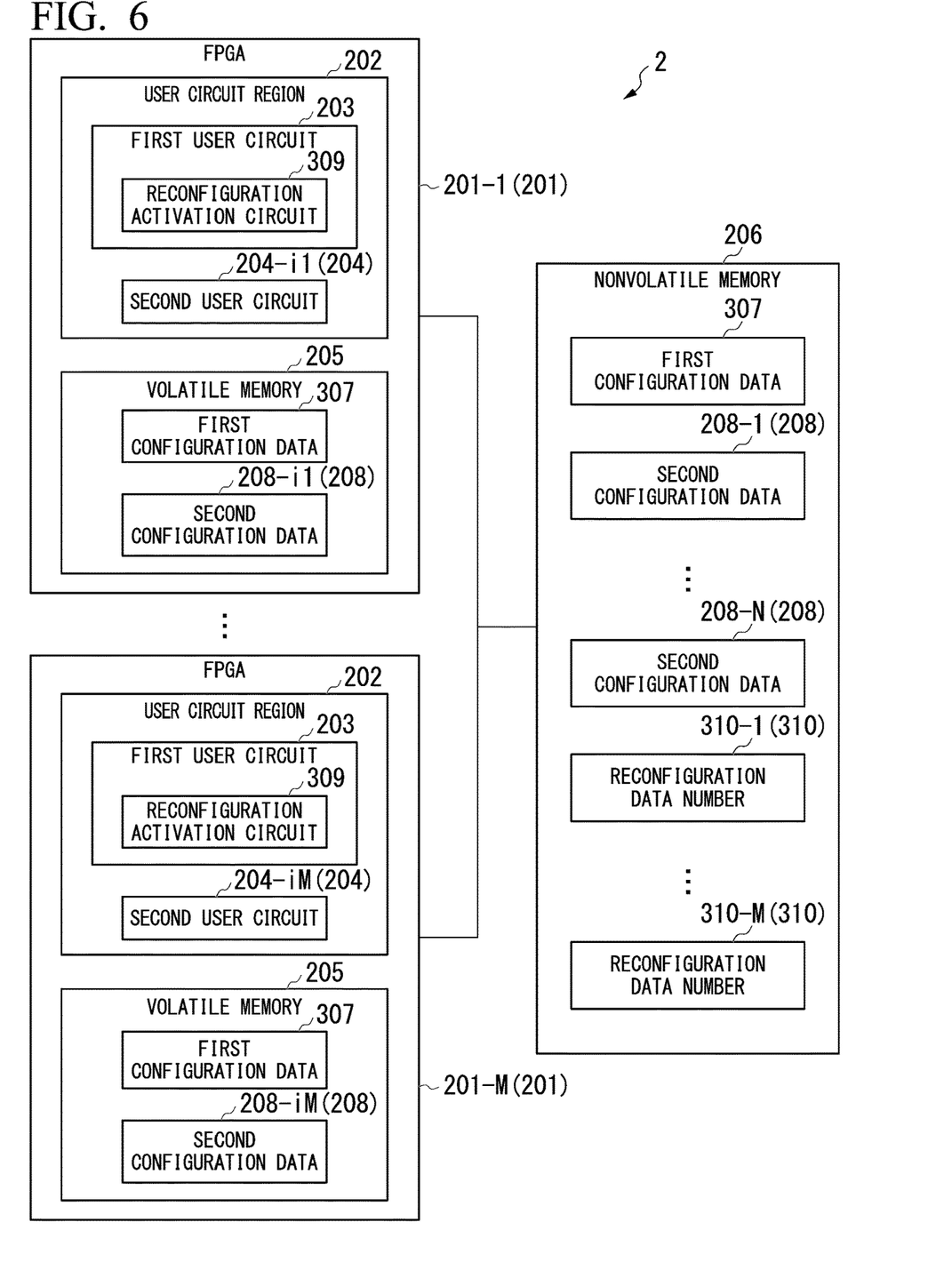
FIG. 6 is a schematic block diagram showing a function configuration of an FPGA system according to a modified example of the example embodiment of the present invention.

FIG. 6 is a schematic block diagram showing a function configuration of an FPGA system 2 according to a modification of the FPGA system 1. As shown in FIG. 6, the FPGA system 2 includes an FPGA 201 and a nonvolatile memory 206. The FPGA 201 includes a user circuit region 202 and a volatile memory 205. The number of FPGAs 201 included in the FPGA system 2 may be one or more.

The FPGA 201, the user circuit region 202, the volatile memory 205, and the nonvolatile memory 206 included in the FPGA system 2 are the same as those in the FPGA system 1, and therefore are denoted by the same reference symbols (201, 202, 205, 206), with descriptions thereof being omitted. When distinguishing between the individual FPGAs 201 included in the FPGA system 2, reference symbols 201-1 to 201-M are used. M represents a positive integer indicating the number of FPGAs 201 that the FPGA system 2 includes.

The nonvolatile memory 206 stores first configuration data 307, second configuration data 208, and a reconfiguration data number 310. The number of pieces of the second configuration data 208 stored by the nonvolatile memory 206 may be one or more. Moreover, the nonvolatile memory 206 stores the reconfiguration data number 310 for each FPGA 201.

The first configuration data 307 stored by the nonvolatile memory 206 in the FPGA system 2 differs from the first configuration data 207 (FIG. 4) in the configuration of the reconfiguration activation circuit 309 described later. Otherwise, it is the same as the first configuration data 207.

The second configuration data 208 stored by the nonvolatile memory 206 in the FPGA system 2 is the same as that in the FPGA system 1 and therefore denoted by the same reference symbol (208), with the description thereof being omitted. When distinguishing between individual pieces of the second configuration data 208 stored by the nonvolatile memory 206, reference symbols 208-1 to 208-N are used. N represents a positive integer indicating the number of pieces of the second configuration data 208 stored in the nonvolatile memory 206.

The nonvolatile memory 206 stores an identification number for identifying any of the second configuration data 208-1 to 208-N as a reconfiguration data number 310. The reconfiguration data number 310 indicates the second configuration data 208 (one of the second configuration data 208-1 to 208-N) to be read by each of the FPGAs 201-1 to 201-M. When distinguishing between the individual reconfiguration data numbers 310 stored by the nonvolatile memory 206, reference symbols 310-1 to 310-M are used.

The reconfiguration data number 310 corresponds to an example of identification information for identifying the second configuration data 208. The identification information for the second configuration data 208 used by the FPGA system 2 as the reconfiguration data number 310 is not limited to the identification number, but may be any information that can identify any of the second configuration data 208-1 to 208-N.

In the FPGA system 2, the user circuit region 202 configures a first user circuit 203 and a second user circuit 204. The first user circuit 203 in the FPGA system 2 is the same as that of the FPGA system 1 except that the operation of the reconfiguration activation circuit 309 differs from that of the reconfiguration activation circuit 209 (FIG. 4) in the FPGA system 1. The same reference symbol (203) is therefore assigned and the description thereof is omitted.

In the FPGA system 2, the second user circuit 204 configured by the user circuit region 202 is configured by deployment in the user circuit region 202 of the configuration indicated by any one of the second configuration data 208 stored by the nonvolatile memory 206. Since the second user circuit 204 configured by the user circuit region 202 in the FPGA system 2 is configured by deployment in the user circuit region 202 of the configuration indicated by the second configuration data 208, the second user circuit 204 has the same function as the second user circuit 204 in the FPGA system 1, and so is assigned the same reference symbol (204) with a description thereof being omitted.

The reconfiguration activation circuit 309 and the reconfiguration data number 310 are associated one-to-one. The reconfiguration activation circuit 309 reads the second configuration data 208 indicated by the reconfiguration data number 310 corresponding to the reconfiguration activation circuit 309 among the second configuration data 208-1 to 208-N stored by the nonvolatile memory 206. In this way, the reconfiguration activation circuit 309 corresponds to the case of the nonvolatile memory 206 storing a plurality of pieces of the second configuration data 208. Otherwise, the reconfiguration activation circuit 309 is the same as the reconfiguration activation circuit 209 (FIG. 4).

The volatile memory 205 in the FPGA system 2 stores the first configuration data 307 and the second configuration data 208 read by the reconfiguration activation circuit 309 among the plurality of pieces of second configuration data 208 stored by the nonvolatile memory 206. In FIG. 6, the reference symbols 208-i1 to 201-iM attached to the second configuration data stored by the volatile memory 205 denote second configuration data 208-1 to 208-i stored by the nonvolatile memory 206, respectively. In FIG. 6, i1 to iM of reference symbols 204-i1 to 204-iM assigned to the second user circuit are the same as i1 to iM of the second configuration data 208-i1 to 208-iM.

When the FPGA 201 of the FPGA system 2 restarts, the FPGA 201 reads the first configuration data 307 from the nonvolatile memory 206, stores the first configuration data 307 in the volatile memory 205, and deploys in the user circuit region 202 the configuration indicated by the stored first reconfiguration data. Thereby, the user circuit region 202 is configured to include the reconfiguration activation circuit 309 in the first user circuit 203. The reconfiguration activation circuit 309 goes into operation upon being configured in the user circuit region 202, and among the second configuration data 208-1 to 208-N stored by the nonvolatile memory 206, reads the second configuration data 208 indicated by the reconfiguration data number 310 corresponding to the reconfiguration activation circuit 309. The reconfiguration activation circuit 309 stores in the volatile memory 205 the read second configuration data 208, and deploys in the user circuit region 202 the configuration indicated by the stored second configuration data 208. Thereby, the user circuit region 202 configures the second user circuit 204.

If the reconfiguration data number 310 is not rewritten by the user between the stoppage and restart of the FPGA 201, the reconfiguration data number 310 stored by the nonvolatile memory 206 before and after the restart is the same. Thereby, the user circuit region 202 can configure the same user circuit (first user circuit and second user circuit) after the restart as before the restart.

Next, the operation of the FPGA system 2 will be described with reference to FIG. 7.

Figure 7:
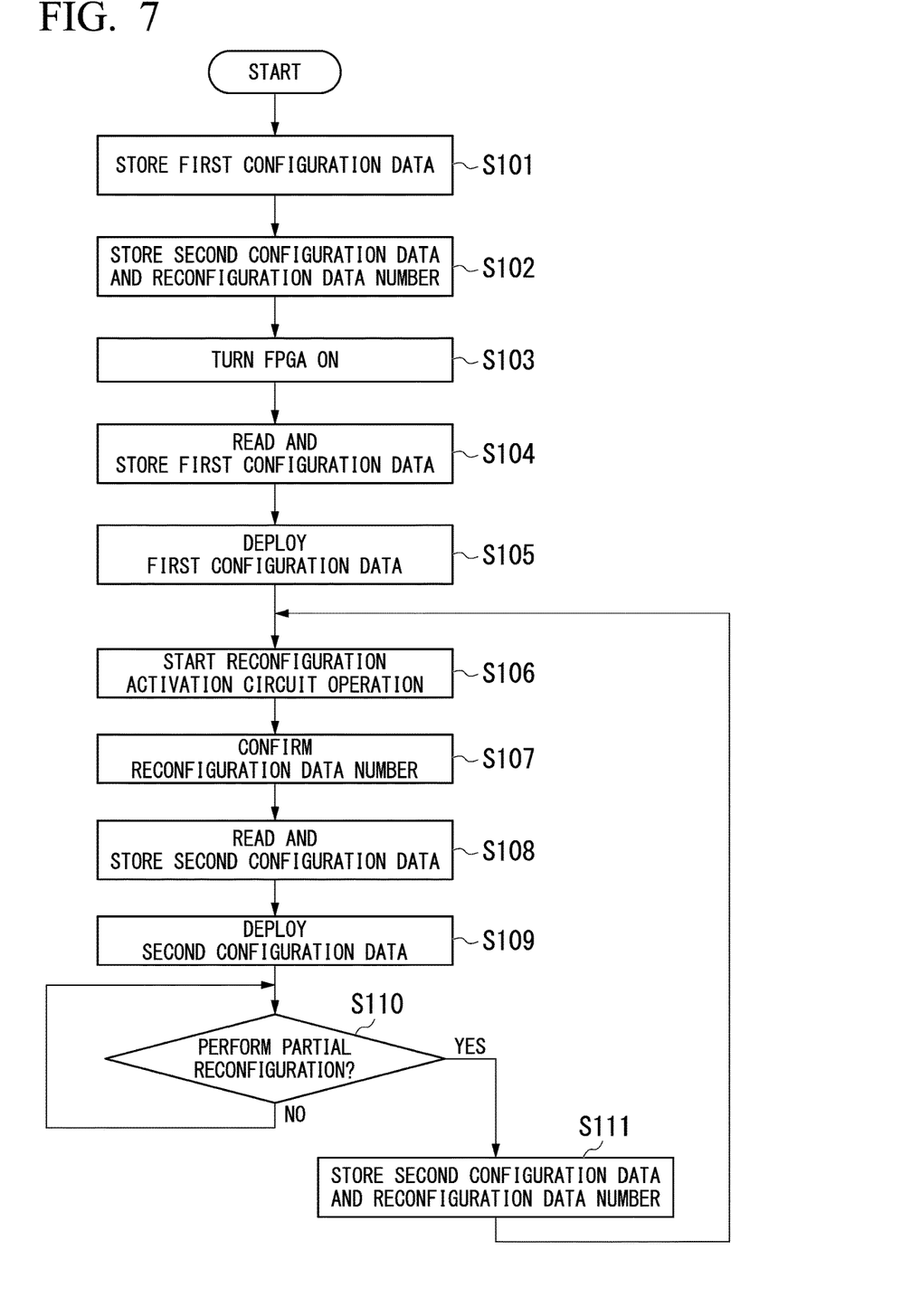
FIG. 7 is a flowchart showing the procedure of the process performed by the FPGA system according to a modification of the example embodiment of the present invention.

FIG. 7 is a flowchart showing the procedure of the process performed by the FPGA system 2.

In the process of FIG. 7, the nonvolatile memory 206 stores the first configuration data while the power of the FPGA is off (Step S101). The nonvolatile memory 206 stores one or more pieces of second configuration data and the reconfiguration data number 310 indicating, for each FPGA 201, the second configuration data to be read by the FPGA 201 (Step S102).

When the power of the FPGA 201 is turned on (Step S103), the FPGA 201 reads the first configuration data 207 from the nonvolatile memory 206 and stores the first configuration data 207 in the volatile memory 205 (Step S104). Then, the FPGA 201 deploys in the user circuit region 202 the configuration indicated by the first configuration data 207 stored in the volatile memory 205 (Step S105). With this deployment, the user circuit region 202 is configured to include the reconfiguration activation circuit 309 in the first user circuit 203.

Next, the reconfiguration activation circuit 309 goes into operation upon being configured in the first user circuit 203 (Step S106). The reconfiguration activation circuit 309 reads the reconfiguration data number associated with the reconfiguration activation circuit 309 itself from the nonvolatile memory 206 (Step S107). Then, the reconfiguration activation circuit 309 reads the second configuration data 208 indicated by the reconfiguration data number 310 read in Step S107 among the second configuration data 208-1 to 208-N stored by the nonvolatile memory 206, and stores the second configuration data 208 in the volatile memory 205 (Step S108). When the partial reconfiguration is performed, the volatile memory 205 has already stored the second configuration data 208, and the reconfiguration activation circuit 309 overwrites the second configuration data 208.

Then, the reconfiguration activation circuit 309 deploys in the user circuit region 202 the configuration indicated by the second configuration data 208 stored in the volatile memory 205 (Step S109). Thereby, the user circuit region 202 configures the second user circuit 204.

Here, the process of the FPGA system 1 branches depending on whether or not partial reconfiguration is performed (Step S110). Whether the partial reconfiguration is performed or not is determined by the user.

If the partial reconfiguration is not performed (Step S110: NO), the process returns to Step S110. During the loop in Step S110, the FPGA 201 keeps the user circuit unchanged.

On the other hand, when performing partial reconfiguration (Step S110: YES), the nonvolatile memory 206 stores the second configuration data 208 and the reconfiguration data number 310 (Step S111).

For example, if there is configuration data to be added for partial reconfiguration, the user inputs the configuration data to be added to the nonvolatile memory 206. The nonvolatile memory 206 stores this configuration data as new second configuration data 208. A new reconfiguration data number 310 is assigned to this new second configuration data 208. For each FPGA 201, the user inputs to the nonvolatile memory 206 the reconfiguration data number 310 indicating the second configuration data 208 that was read in the partial reconfiguration, and the nonvolatile memory 206 stores the reconfiguration data number 310 for each FPGA 201. The reconfiguration data number 310 already stored by the nonvolatile memory 206 is overwritten by the newly input reconfiguration data number 310.

If there is no configuration data added by the user, it is possible to input only the reconfiguration data number. The nonvolatile memory 206 stores the reconfiguration data number 310 for each FPGA 201. Also in this case, the reconfiguration data number 310 already stored in the nonvolatile memory 206 is overwritten by the newly input reconfiguration data number 310.

After Step S111, the process returns to Step S106.

In the case of the FPGA system 1, the nonvolatile memory 206 stores only one second configuration data 208, and does not store the reconfiguration data number 310. For this reason, the second configuration data 208 read from the nonvolatile memory 206 by the reconfiguration activation circuit 209 is uniquely determined, with the reconfiguration activation circuit 209 not referring to the reconfiguration data number 310 when reading the second configuration data 208. Otherwise, the processing performed by the FPGA system 1 is the same as the processing performed by the FPGA system 2 described with reference to FIG. 7.

As described above, the nonvolatile memory 206 stores the first configuration data 207 indicating the circuit configuration of the portion other than the portion to be partially reconfigured by the FPGA 201 and the second configuration data 208 indicating the circuit configuration of the portion to be partially reconfigured, with the configuration data indicating the configuration of the reconfiguration activation circuit 209 being included in the first configuration data 207.

Thereby, in the FPGA system 1, the FPGA 201 stores the configuration data in the volatile memory (the volatile memory 205), and upon being restarted following the execution of a partial reconfiguration, can make the circuit configured by the user circuit region 202 of the FPGA 201 the circuit after execution of the partial reconfiguration.

Specifically, in the FPGA system 1, the nonvolatile memory 206 stores the first configuration data 207 and the second configuration data 208 separately. The FPGA 201 reads the first configuration data 207 from the nonvolatile memory 206 and deploys the first configuration data 207 in the user circuit region 202, whereby the user circuit region 202 configures the reconfiguration activation circuit 209. The reconfiguration activation circuit 209 reads the second configuration data 208 from the nonvolatile memory 206 and deploys the second configuration data 208 in the user circuit region 202, whereby, the user circuit region 202 configures the user circuits (the first user circuit 203 and the second user circuit 204) after the partial reconfiguration.

The same applies to the FPGA system 2.

Further, the nonvolatile memory 206 stores a plurality of pieces of second configuration data 208 and reconfiguration data number 310 for identifying the second configuration data 208 to be read by the FPGA 201 among the plurality of pieces of second configuration data 208.

Accordingly, in the FPGA system 2, a plurality of pieces of the second configuration data 208 can be stored in the nonvolatile memory 206, and the FPGA 201 can be made to read the second configuration data 208 specified by the user. In this regard, according to the FPGA system 2, management of the plurality of pieces of the second configuration data 208 can be performed relatively easily.

In the FPGA system 2, the FPGA 201 stores configuration data in the volatile memory (the volatile memory 205), and upon being restarted following the execution of a partial reconfiguration, can make the circuit configured by the user circuit region 202 of the FPGA 201 the circuit after execution of the partial reconfiguration. In particular, in the FPGA system 2, the second configuration data 208 to be read after the restart of the FPGA 201 can be specified by the FPGA 201 using the reconfiguration data number 310.

The FPGA system 2 includes a plurality of FPGAs 201. The nonvolatile memory 206 stores the reconfiguration data number 310 for each FPGA 201.

Thereby, in the FPGA system 2, even when the FPGA system 2 includes a plurality of FPGAs 201, a plurality of pieces of the second configuration data 208 can be stored in the nonvolatile memory 206, and the FPGA 201 can be made to read the second configuration data 208 specified by the user. In this regard, according to the FPGA system 2, management of the plurality of pieces of the second configuration data 208 can be performed relatively easily.

In the FPGA system 2, the FPGA 201 stores the configuration data in the volatile memory (the volatile memory 205), and upon being restarted following the execution of a partial reconfiguration, can make the circuit configured by the user circuit region 202 of the FPGA 201 the circuit after execution of the partial reconfiguration. In particular, in the FPGA system 2, the second configuration data 208 to be read after the restart of the FPGA 201 can be specified by each of the plurality of FPGAs 201 using the reconfiguration data number 310.

Next, the configuration of another example embodiment of the present invention will be described with reference to FIG. 8.

Figure 8:
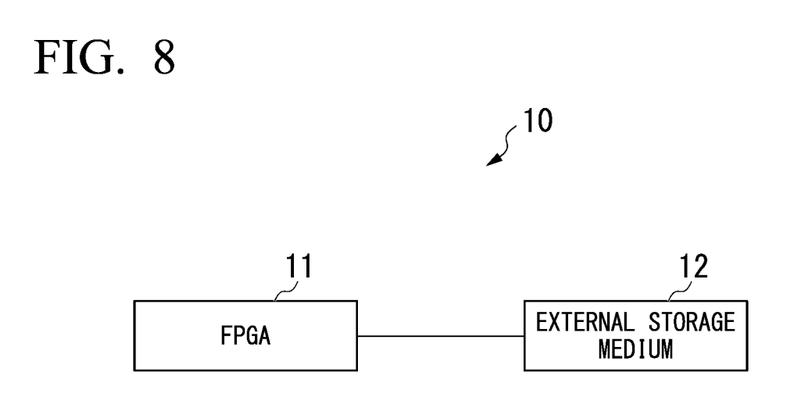
FIG. 8 is a diagram showing an example of the configuration of the FPGA system according to another example embodiment of the present invention.

FIG. 8 is a diagram showing an example of a configuration of an FPGA system according to another example embodiment of the present invention. The FPGA system 10 illustrated in FIG. 8 includes an FPGA 11 capable of partial reconfiguration, and an external storage medium 12 that is located outside the FPGA 11 and stores configuration data read by the FPGA 11.

In such a configuration, the external storage medium 12 stores first configuration data indicating the circuit configuration of the portion other than the portion to be partially reconfigured, and second configuration data indicating the circuit configuration of the portion to be partially reconfigured, with the first configuration data including configuration data indicating the configuration of a reconfiguration activation circuit for reading the second configuration data from the external storage medium and deploying the configuration indicated by the second configuration data.

Accordingly, in the FPGA system 10, the FPGA 11 stores the configuration data in the volatile memory, and upon being restarted following the execution of a partial reconfiguration, can make the circuit configured by the FPGA 11 the circuit after execution of the partial reconfiguration.

A program for realizing all or some of the processing performed by the FPGA system 1 or 2 may be recorded on a computer-readable recording medium, and by reading the program recorded on the recording medium into a computer system and executing the program, the processing of each unit may be performed. The "computer system" referred to here includes an OS and hardware such as peripheral devices.

The "computer-readable recording medium" refers to a portable medium such as a flexible disk, a magneto-optical disk, a ROM, and a CD-ROM, and a storage device such as a hard disk built into a computer system. Further, the program may be one for realizing some of the functions described above, or may be for realizing the functions described above in combination with a program already recorded in the computer system.

Example embodiments of the present invention have been described in detail with reference to the drawings. However, the specific configuration is not limited to the example embodiments, and any design change that does not depart from the gist of the present invention is included in the present invention.

INDUSTRIAL APPLICABILITY

The present invention may be applied to an FPGA system, a partial reconfiguration execution method, and a storage medium.

REFERENCE SYMBOLS

1, 2, 10: FPGA system
11, 201, 201-1~201-M: FPGA
12: External storage medium
202: User circuit region
203: First user circuit
209, 309: Reconfiguration activation circuit
204, 204i1~204iM: Second user circuit
205: Volatile memory
206: Nonvolatile memory
207, 307: First configuration data
208, 208-1~208-N, 208-i1~208iM: Second configuration data
310, 310-1~310-M: Reconfiguration data number

The invention claimed is:

1. A field programmable gate array (FPGA) system comprising:

an FPGA that includes a first region that is not subject to a partial reconfiguration and a second region that is subject to the partial reconfiguration; and a non-transitory nonvolatile external-storage medium that is positioned outside of the FPGA and stores configuration data that is readable by the FPGA, wherein the external storage medium stores first configuration data and second configuration data, the first configuration data indicating a configuration to be deployed in the first region, the second configuration data indicating a configuration to be deployed in the second region, the first configuration data includes configuration data indicating a configuration of a reconfiguration activation circuit for reading the second configuration data from the external storage medium and deploying the configuration indicated by the second configuration data, when the reconfiguration activation circuit is configured in the first region, the reconfiguration activation circuit reads the second configuration data from the external storage medium and deploys the configuration indicated by the second configuration data in the second region, and when the second configuration data is updated, the reconfiguration activation circuit reads the updated second configuration data from the external storage medium and deploys the configuration indicated by the updated second configuration in the second region.

2. The FPGA system according to claim 1, wherein the second configuration data includes a plurality of pieces of second configuration, the external storage medium stores the plurality of pieces of second configuration data and identification information for identifying second configuration data to be read by the FPGA among the plurality of pieces of second configuration data, and when the identification information is updated, the reconfiguration activation circuit reads second configuration data identified by the updated identification information from the external storage medium and deploys the configuration indicated by the read second configuration data.

3. The FPGA system according to claim 2, wherein the FPGA includes a plurality of FPGAs, the identification information includes a plurality of pieces of identification information respectively associated with the plurality of FPGAs, and each of the plurality of pieces of identification information is used for identifying second configuration data read by the FPGA associated with the identification information among the plurality of pieces of second configuration data, and the external storage medium stores the plurality of pieces of identification information.

4. A partial reconfiguration execution method comprising:

storing first configuration data and second configuration data in an nonvolatile external storage medium, the external storage medium being positioned outside of a field programmable gate array (FPGA) and storing configuration data that is readable by the FPGA, the FPGA including a first region that is not subject to a partial reconfiguration and a second region that is subject to the partial reconfiguration, the first configuration data indicating a configuration of to be deployed in the first region, the first configuration data including configuration data indicating a configuration of a reconfiguration activation circuit, the second configuration data indicating a configuration of to be deployed in the second region;

configuring, by the FPGA, the configuration activation circuit in the first region by reading the first configuration data from the external storage medium and by deploying the configuration indicated by the first configuration data;

when the reconfiguration activation circuit is configured in the first region, reading the second configuration data from the external storage medium and deploying the configuration indicated by the second configuration data in the second region, by the configured reconfiguration activation circuit; and after the second configuration data stored in the external storage medium is updated, further reading the updated second configuration data from the external storage medium and deploying the configuration indicated by the updated second configuration data in the second region, by the reconfiguration activation circuit.

5. A partial reconfiguration execution method comprising:

storing, in an nonvolatile external storage medium, first configuration data, a plurality of pieces of second configuration data and identification information, the external storage medium being positioned outside of a field programmable gate array (FPGA)-and storing configuration data that is readable by the FPGA, the FPGA including a first region that is not subject to a partial reconfiguration and a second region that is subject to the partial reconfiguration, the first configuration data indicating a configuration to be deployed in the first region, the first configuration data including configuration data indicating a configuration of a reconfiguration activation circuit, the plurality of pieces of second configuration data indicating a configuration to be deployed in the second region, the identification information being information for identifying second configuration data to be read by the FPGA among the plurality of pieces of second configuration data;

configuring, by the FPGA, the configuration activation circuit in the first region by reading the first configuration data from the external storage medium and by deploying the configuration indicated by the first configuration data;

when the reconfiguration activation circuit is configured in the first region, reading the second reconfiguration data identified by the identification information from the external storage medium and deploying the configuration identified by second configuration data, by the configured reconfiguration activation circuit;

after the second configuration data that is stored in the external storage medium and is identified by the identification information is updated, further reading the updated second configuration data identified by the identification information from the external storage medium and deploying the configuration indicated by the updated second configuration data, by the reconfiguration activation circuit; and when the reconfiguration activation circuit deploys the configuration indicated by the second configuration data or the configuration indicated by the updated second configuration data after the identification information stored in the external storage medium is updated, reading the second configuration data identified by the updated identification information from the external storage medium and deploying the configuration indicated by the second configuration data, by the reconfiguration activation circuit.

6. A non-transitory nonvolatile storage medium comprising:
- a first storage area storing a first configuration data that is readable by a field programmable gate array (FPGA), the first configuration data indicating a configuration to be deployed in a first region of the FPGA that is not subject to a partial reconfiguration; and
- a second storage area storing a second configuration data that is readable by the FPGA, the second configuration data indicating a configuration to be deployed in a second region of the FPGA that is subject to the partial reconfiguration,
- wherein the first configuration data includes configuration data indicating a configuration of a reconfiguration activation circuit for reading the second configuration data from the storage medium and deploying the configuration indicated by the second configuration data,
- when the reconfiguration activation circuit is configured in the first region of the FPGA, the reconfiguration activation circuit reads the second configuration data from the storage medium and deploys the configuration indicated by the second configuration data in the second region, and
- when the second configuration data is updated, the reconfiguration activation circuit reads the updated second configuration data from the storage medium and deploys the configuration indicated by the updated second configuration data in the second region.

* * * * *